(12) United States Patent
Nagano et al.

(10) Patent No.: US 8,779,364 B2
(45) Date of Patent: Jul. 15, 2014

(54) SCINTILLATOR PANEL, RADIATION DETECTION APPARATUS, AND METHOD OF MANUFACTURING THEM

(75) Inventors: Kazumi Nagano, Fujisawa (JP); Satoshi Okada, Tokyo (JP); Keiichi Nomura, Honjo (JP); Yohei Ishida, Honjo (JP); Tomoaki Ichimura, Kitamoto (JP); Yoshito Sasaki, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 179 days.

(21) Appl. No.: 13/352,288

(22) Filed: Jan. 17, 2012

(65) Prior Publication Data
US 2012/0187299 A1    Jul. 26, 2012

(30) Foreign Application Priority Data

Jan. 24, 2011  (JP) ................... 2011-012317

(51) Int. Cl.
*G01T 1/20* (2006.01)
*G01T 1/202* (2006.01)
*G21K 4/00* (2006.01)

(52) U.S. Cl.
CPC . *G01T 1/20* (2013.01); *G01T 1/202* (2013.01); *G21K 4/00* (2013.01)
USPC .................................................. 250/361 R

(58) Field of Classification Search
CPC ......... G01T 1/2002; G01T 1/20; G01T 1/202; G21K 4/00; G21K 2004/06
USPC .................................................. 250/361 R
See application file for complete search history.

(56) References Cited

U.S. PATENT DOCUMENTS

| | | | |
|---|---|---|---|
| 5,856,699 A | 1/1999 | Hayashi et al. | |
| 5,902,491 A * | 5/1999 | Carpenter et al. | ................ 216/2 |
| 6,352,875 B1 | 3/2002 | Hayashi et al. | |
| 6,483,567 B1 | 11/2002 | Okada | |
| 6,600,157 B2 | 7/2003 | Watanabe et al. | |
| 6,608,312 B1 | 8/2003 | Okada et al. | |
| 6,777,690 B2 | 8/2004 | Homme et al. | |
| 6,847,041 B2 | 1/2005 | Okada et al. | |
| 7,244,945 B2 * | 7/2007 | Okada et al. | ............. 250/370.11 |

(Continued)

FOREIGN PATENT DOCUMENTS

| | | |
|---|---|---|
| CN | 1519581 A | 8/2004 |
| JP | 6-230198 A | 8/1994 |
| JP | 2002-243859 A | 8/2002 |
| JP | 2010-14469 A | 1/2010 |

OTHER PUBLICATIONS

Chinese Office Action dated Apr. 28, 2014 in Chinese Application No. 201210015488.6.

*Primary Examiner* — Marcus Taningco
(74) *Attorney, Agent, or Firm* — Fitzpatrick, Cella, Harper and Scinto

(57) ABSTRACT

A method of manufacturing a scintillator panel including a scintillator layer which converts a radiation into light, includes a growing step of growing a scintillator including a plurality of columnar crystals on a first substrate; a fixing step of fixing a second substrate to a surface of the scintillator that is opposite to a surface on a side of the first substrate; a separation step of separating the first substrate from the scintillator; and a removal step of removing, from the scintillator, a portion of a predetermined thickness from an exposed surface of the scintillator that is exposed in the separation step, to form the scintillator layer.

5 Claims, 5 Drawing Sheets

(56) References Cited

U.S. PATENT DOCUMENTS

| | | |
|---|---|---|
| 7,308,074 B2 * | 12/2007 | Jiang et al. ............... 378/19 |
| 7,705,376 B2 | 4/2010 | Ishida et al. |
| 7,749,791 B2 | 7/2010 | Ishida et al. |
| 7,888,170 B2 | 2/2011 | Miyata et al. |
| 2003/0178570 A1 * | 9/2003 | Tsunota et al. ......... 250/370.11 |
| 2005/0035298 A1 | 2/2005 | Okada et al. |
| 2010/0034351 A1 * | 2/2010 | Yanagita et al. ............. 378/62 |
| 2011/0038111 A1 | 2/2011 | Okada et al. |

* cited by examiner

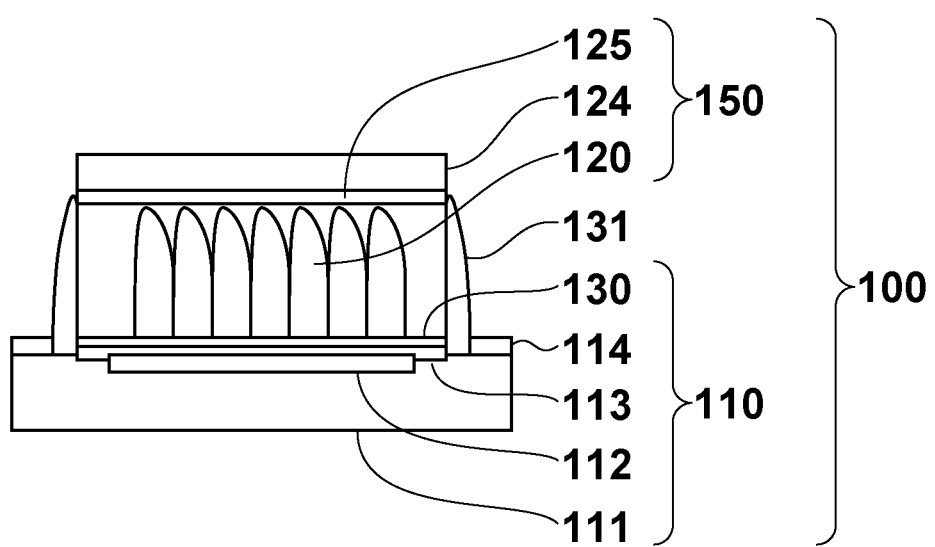
F I G. 1

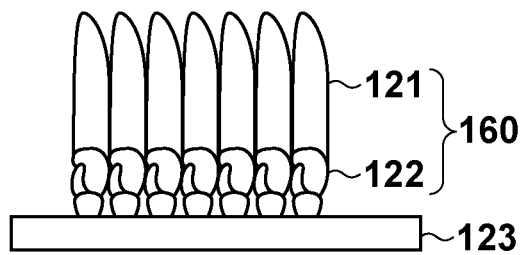
F I G. 2A
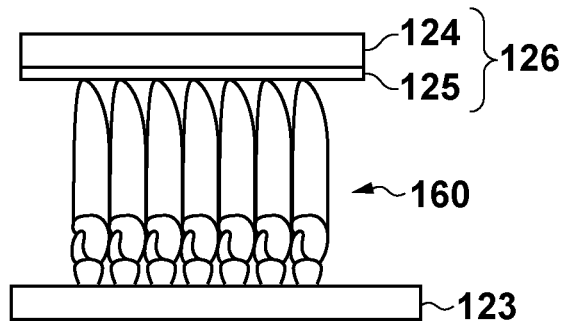
F I G. 2B
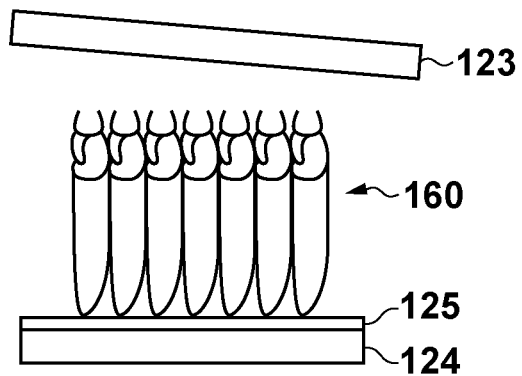
F I G. 2C
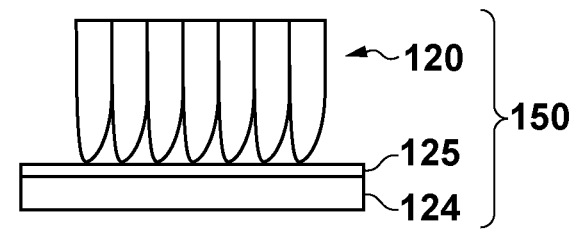
F I G. 2D

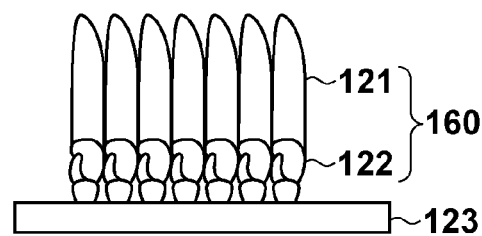
FIG. 5A
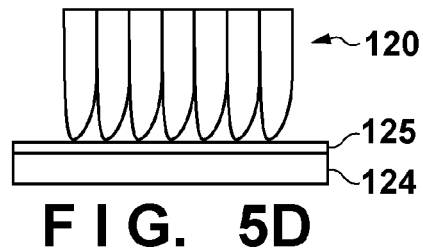
FIG. 5D
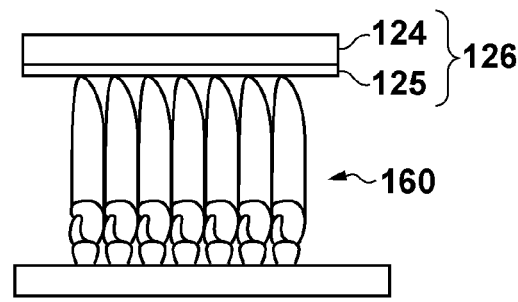
FIG. 5B
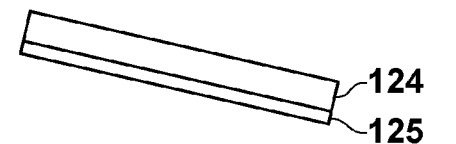
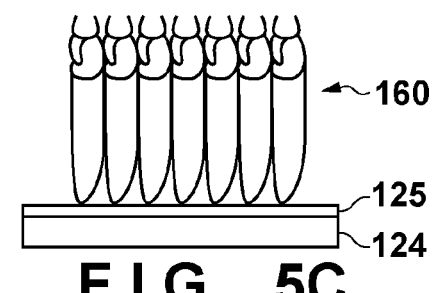
FIG. 5C
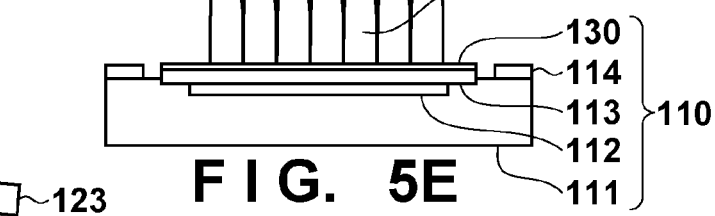
FIG. 5E
FIG. 5F

SCINTILLATOR PANEL, RADIATION DETECTION APPARATUS, AND METHOD OF MANUFACTURING THEM

BACKGROUND OF THE INVENTION

1. Field of the Invention

The present invention relates to a scintillator panel, radiation detection apparatus, and method of manufacturing them.

2. Description of the Related Art

There is known a radiation detection apparatus including a scintillator for converting a radiation into light, and a sensor for detecting the light converted by the scintillator. The scintillator is made up of a set of columnar crystals and formed on a substrate by vapor deposition. Japanese Patent Laid-Open No. 2002-243859 discloses a method of removing unevenness from a surface of a scintillator formed by vapor deposition on the side of a vapor deposition end surface. Japanese Patent Laid-Open No. 06-230198 discloses a method of planarizing a surface of a scintillator formed by vapor deposition on the side of a vapor deposition end surface.

An initial growth layer (layer formed in the initial stage of vapor deposition) exists on the vapor deposition starting surface side of a scintillator formed by vapor deposition. The initial growth layer may scatter light that is converted from a radiation before the light reaches a photoelectric converter because crystals have a granular shape or the columnar crystal has a small diameter. Such scattering may decrease the sharpness of an image sensed by a sensor.

The initial growth layer is stress-sensitive. When a temperature change causes a stress-strain between the building members of a radiation detection apparatus, the scintillator may peel off or a cohesion failure may occur within the scintillator.

SUMMARY OF THE INVENTION

The present invention provides a technique advantageous for improving sharpness and/or improving durability.

The first aspect of the present invention provides a method of manufacturing a scintillator panel including a scintillator layer which converts a radiation into light, the method comprising: a growing step of growing a scintillator including a plurality of columnar crystals on a first substrate; a fixing step of fixing a second substrate to a surface of the scintillator that is opposite to a surface on a side of the first substrate; a separation step of separating the first substrate from the scintillator; and a removal step of removing, from the scintillator, a portion of a predetermined thickness from an exposed surface of the scintillator that is exposed in the separation step, to form the scintillator layer.

The second aspect of the present invention provides a method of manufacturing a radiation detection apparatus, comprising a step of arranging a sensor panel which detects light converted by a scintillator layer, on a surface of the scintillator layer that is opposite to a surface on a side of a second substrate on a scintillator panel manufactured by a manufacturing method defined as the first aspect of the present invention.

The third aspect of the present invention provides a scintillator panel comprising a scintillator layer which converts a radiation into light, the scintillator layer having a structure in which a plurality of columnar crystals are arranged, each columnar crystal having a convex surface at one end thereof and a planarized processed surface at the other end thereof.

The fourth aspect of the present invention provides a scintillator panel comprising a scintillator layer which converts a radiation into light, the scintillator layer having a structure in which a plurality of columnar crystals are arranged, each columnar crystal having planarized processed surfaces at one end thereof and the other end thereof.

The fifth aspect of the present invention provides a radiation detection apparatus comprising: a scintillator panel defined as the third or fourth aspect of the present invention; and a sensor panel which detects light converted by a scintillator layer of the scintillator panel.

Further features of the present invention will become apparent from the following description of exemplary embodiments with reference to the attached drawings.

BRIEF DESCRIPTION OF THE DRAWINGS

FIG. 1 is a sectional view schematically showing the structure of a radiation detection apparatus according to the first embodiment of the present invention;

FIGS. 2A to 2D are sectional views showing a radiation detection apparatus manufacturing method according to the first embodiment of the present invention;

FIGS. 5A to 5F are sectional views showing a radiation detection apparatus manufacturing method according to the fourth embodiment of the present invention.

DESCRIPTION OF THE EMBODIMENTS

Figure 3A:
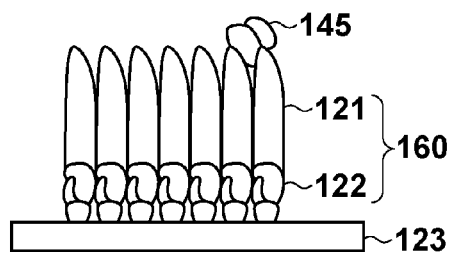
FIGS. 3A to 3F are sectional views showing a radiation detection apparatus manufacturing method according to the second embodiment of the present invention.

Preferred embodiments of the present invention will now be described with reference to the accompanying drawings.

The structure of a radiation detection apparatus 100 according to the first embodiment of the present invention will be described with reference to FIG. 1. The radiation detection apparatus 100 includes a scintillator panel 150 including a scintillator layer (wavelength converter layer) 120 for converting a radiation into light (for example, visible light), and a sensor panel 110 for detecting the light converted by the scintillator layer 120 of the scintillator panel 150. In addition to the scintillator layer 120, the scintillator panel 150 can include, for example, a second substrate 124 serving as a protection substrate, and a bonding layer 125 which bonds the second substrate 124 and scintillator layer 120. The sensor panel 110 can include a sensor substrate 111 having a pixel region 112 where a plurality of pixels are arranged, a protection layer 113 which protects the pixel region 112, and an electrode 114. The scintillator panel 150 and sensor panel 110 can be bonded by an adhesion layer 130. The scintillator layer 120 can be sealed with a sealing material 131 which surrounds it.

The sensor substrate 111 can be made of a material such as glass or a heat-resistant plastic. Each pixel arranged in the pixel region 112 can include, for example, a photoelectric converter, a switching element, and a gate line for transferring a signal to turn on/off the switching element. The gate line can be connected to a processing circuit or processing unit via the electrode 114.

A method of manufacturing the radiation detection apparatus 100 shown in FIG. 1 will be explained with reference to FIGS. 2A to 2D. In a growing process shown in FIG. 2A, a scintillator 160 containing a plurality of columnar crystals is grown on a first substrate 123 by vapor deposition. The scintillator 160 is a member finally serving as the scintillator layer 120. In this specification, vapor deposition is used as a term including chemical vapor deposition. The scintillator 160 is made of, for example, a cesium iodide-containing material. The scintillator 160 has an initial growth layer 122 on the side of the first substrate 123, that is, the side of the vapor deposition starting surface. In the initial growth layer 122, crystals have a granular shape or the columnar crystal has a small diameter. The initial growth layer 122 can have a thickness of, for example, 0 to 150 μm though it depends on conditions. After forming the initial growth layer, vapor deposition continues, forming a columnar crystal layer 121 from a set of columnar crystals.

A preferable example of the material for forming a scintillator is CsI:Tl mainly containing an alkali halide. Other examples are CsI:Na, NaI:Tl, LiI:Eu, and KI:Tl. For example, CsI:Tl is prepared by simultaneously depositing CsI and TlI. The first substrate 123 suffices to resist vapor deposition conditions for forming the scintillator 160, and can use materials such as a metal, resin, glass, and ceramic.

In a fixing process shown in FIG. 2B, the second substrate 124 is fixed or bonded via the bonding layer 125 to a surface of the scintillator 160 that is opposite to a surface on the side of the first substrate 123. The bonding layer 125 and second substrate 124 form a protection member 126 which protects the scintillator 160.

The second substrate 124 serving as a protection substrate is a substrate for protecting the scintillator 160 (scintillator layer 120) from an external stress. The second substrate 124 can adopt, for example, a metal plate, metal foil, resin plate, glass plate, or ceramic plate. The second substrate 124 is preferably made of a material having high X-ray transmittance. For example, the second substrate 124 is preferably a resin substrate of CFRP or amorphous carbon, or a sheet prepared by stacking a metal foil and resin.

Part of light converted by the scintillator 160 (scintillator layer 120) can reach the second substrate 124, be reflected by the second substrate 124, and return to the sensor panel 110. To improve the sensitivity of the radiation detection apparatus 100, the reflectance of the second substrate 124 on the side of the scintillator 160 is preferably high. For this purpose, the second substrate 124 may be a highly reflective metal substrate made of Al or Au, or a substrate obtained by forming a reflecting layer made of Al or Au on a base material.

The bonding layer 125 is a layer for holding the scintillator 160 by the second substrate 124. The bonding layer 125 can employ, for example, acrylic-, epoxy-, olefin-, or silicone-based adhesive or pressure-sensitive adhesive. The pressure-sensitive adhesive is desirably an acrylic-based pressure-sensitive adhesive material especially high in light transmittance. The adhesive suffices to be a thermoplastic resin, thermoset resin, or thermoplastic solidification type hot-melt resin. The hot-melt resin exhibits adhesion to other organic and inorganic materials in a molten state, and does not exhibit adhesion in a solid state at room temperature. The hot-melt resin contains neither a solvent nor medium. Examples of the hot-melt resin are resins containing polyolefin-, polyester-, and polyamide-based materials as base polymers (main components).

In a separation process shown in FIG. 2C, the first substrate 123 is separated from the scintillator 160. In a removal process shown in FIG. 2D, a portion of a predetermined thickness (to be referred to as a growth starting side portion) from a surface of the scintillator 160 that has been exposed upon the separation process shown in FIG. 2C, and typically a portion including the initial growth layer 122 is removed from the scintillator 160. A method of removing the growth starting side portion from the scintillator 160 is, for example, mechanical polishing (lapping), laser cutting, ion beam polishing, or blast polishing. This processing forms a scintillator layer 120 having a planarized or processed surface on a surface of the scintillator from which growth has started.

Mechanical polishing can be achieved by, for example, a method of fixing a scintillator, bringing a rotating disk or columnar polishing tool into press contact with a surface of the scintillator on the side of the initial growth layer, and polishing the surface. Blast polishing is processing of colliding abrasive particles with a surface to be polished, and polishing the surface. A preferable example is dry-ice blasting in which particles evaporate upon collision and do not attach to the surface to be polished.

The thickness of the growth starting side portion to be removed can be determined depending on the thickness of the initial growth layer 122. The thickness of the growth starting side portion to be removed is, for example, 0 to 250 μm, and preferably 10 to 130 μm.

The scintillator surface after removing the growth starting side portion of the scintillator is defined by the bottom surfaces of scintillator columns and gaps between the scintillator columns. The bottom surface of one scintillator column has a surface roughness Ra of 1 μm or less, and desirably 0.1 μm or less.

After the removal process shown in FIG. 2D, the scintillator panel 150 is obtained. The scintillator layer 120 of the scintillator panel 150 has a structure in which a plurality of columnar crystals are arranged. That is, the scintillator layer contains the scintillator. Each columnar crystal has a convex surface at one end (lower end in FIG. 2D) and a planarized or processed surface at the other end (upper end in FIG. 2D).

An assembly process to be executed next will be explained with reference to FIG. 1. In the assembly process, the sensor panel 110 for detecting light converted by the scintillator layer 120 is arranged on a surface of the scintillator layer 120 of the scintillator panel 150 that is opposite to a surface on the side of the second substrate 124. In the assembly process, for example, the sensor panel 110 is bonded via the adhesion layer 130 to a surface of the scintillator layer 120 that is opposite to a surface on the side of the second substrate 124. Further, in the assembly process, the scintillator layer 120 is sealed with the sealing material 131, and a processing circuit or processing unit is connected to the electrode 114.

The adhesion layer 130 can be a general adhesive material or pressure-sensitive adhesive material similar to the bonding layer 125. Particularly, to increase the adhesion strength between the scintillator layer 120 and the sensor panel 110 and improve the durability of the radiation detection apparatus, the adhesive is preferably applied to be injected between the columnar crystals of the scintillator layer 120.

According to the first embodiment, a portion on the side of the initial growth layer 122 is removed from the scintillator. This can reduce scattering of light converted from a radiation before the light reaches the sensor panel (photoelectric converter). Hence, a radiation detection apparatus having high sharpness can be obtained. Also, the durability of the scintillator panel or radiation detection apparatus can be improved by removing a portion on the side of the initial growth layer from the scintillator.

The structure and manufacturing method of a radiation detection apparatus and scintillator panel according to the second embodiment of the present invention will be explained with reference to FIGS. 3A to 3F. Note that matters not mentioned here can comply with those in the first embodiment.

In a growing process shown in FIG. 3A, a scintillator 160 containing a plurality of columnar crystals is grown on a first substrate 123 by vapor deposition. The scintillator 160 is a member finally serving as a scintillator layer 120. In this growing process, a projection 145 may be formed on a surface (to be referred to as a growth end surface) of the scintillator 160 that is opposite to a surface on the side of the first substrate 123. The cause of the projection 145 is, for example, local abnormal growth, attachment of a foreign substance, or the uneven surface of the first substrate 123.

Figure 3B:
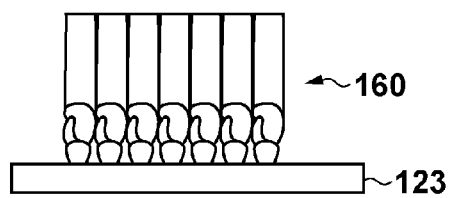

In a removal process shown in FIG. 3B, a portion of a predetermined thickness (to be referred to as a growth end side portion) from the growth end surface is removed from the scintillator 160. The removal method and conditions for the growth end side portion can comply with the method and conditions in the removal process shown in FIG. 2D in the first embodiment. This processing forms a planarized or processed surface on a surface of the scintillator 160 that is opposite to a surface on the side of the first substrate 123.

Figure 3C:
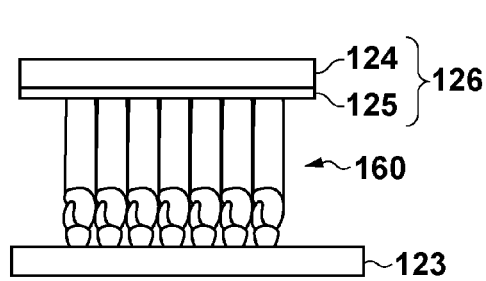

In a fixing process shown in FIG. 3C, a second substrate 124 is fixed or bonded via a bonding layer 125 to a surface of the scintillator 160 that is opposite to a surface on the side of the first substrate 123, that is, to the planarized surface. The bonding layer 125 and second substrate 124 form a protection member 126 which protects the scintillator 160. Matters not mentioned here can comply with the fixing process shown in FIG. 2B in the first embodiment.

Figure 3D:
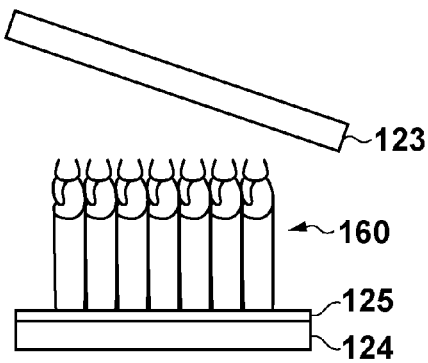
Figure 3E:
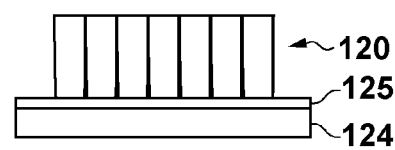
Figure 3F:
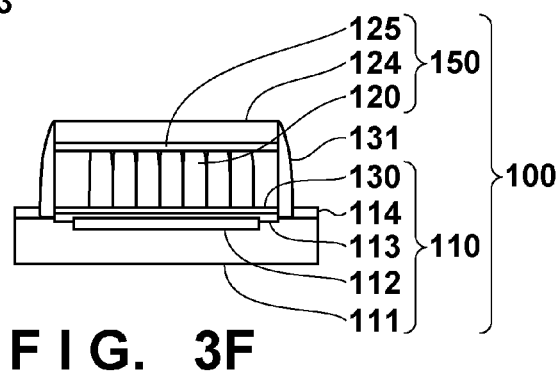

Then, a separation process shown in FIG. 3D, a removal process shown in FIG. 3E, and an assembly process shown in FIG. 3F are executed. The respective processes can be the same as the separation process shown in FIG. 2C, the removal process shown in FIG. 2D, and the assembly process described with reference to FIG. 1.

The second embodiment can reduce a bonding failure in the fixing process that arises from the projection 145.

The structure and manufacturing method of a radiation detection apparatus and scintillator panel according to the third embodiment of the present invention will be explained with reference to FIGS. 4A to 4D. Note that matters not mentioned here can comply with those in the first embodiment.

Figure 4A:
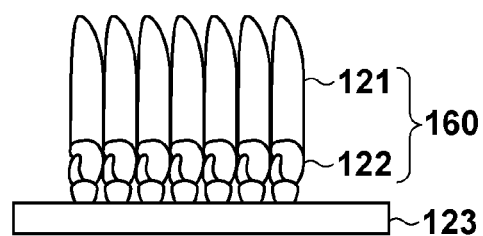
FIGS. 4A to 4D are sectional views showing a radiation detection apparatus manufacturing method according to the third embodiment of the present invention.

In a growing process shown in FIG. 4A, a scintillator 160 containing a plurality of columnar crystals is grown on a first substrate 123 by vapor deposition. This growing process can comply with the growing process shown in FIG. 2A in the first embodiment.

Figure 4B:
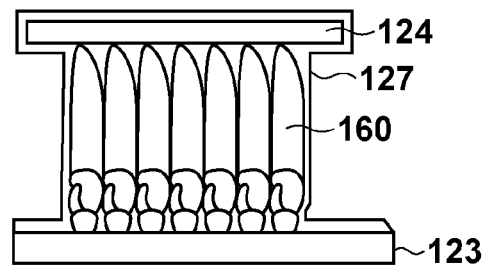

In a fixing process shown in FIG. 4B, a second substrate 124 is fixed to a surface of the scintillator 160 that is opposite to a surface on the side of the first substrate 123. More specifically, the second substrate 124 serving as a protection substrate is superimposed on a surface of the scintillator 160 that is opposite to a surface on the side of the first substrate 123. Then, a protection film 127 covers the side surface of the scintillator 160 and portions of the exposed surfaces of the first substrate 123 and second substrate 124 that continue from the side surface of the scintillator 160. The protection film 127 can be formed by, for example, thermal CVD. The protection film 127 is formed even in a space between columnar crystals which form the scintillator 160, thereby increasing the strength of the scintillator 160. The protection film 127 fixes the second substrate 124 to the scintillator 160. The protection film 127 can be made of, for example, a parylene resin or polyurea resin. The parylene resin and polyurea resin can be formed by thermal CVD, and have high light transparency and low moisture permeability. Especially when a deliquescent scintillator is adopted, the protection film 127 low in moisture permeability is preferably used.

The same process as the removal process shown in FIG. 3B in the second embodiment may be executed between the growing process shown in FIG. 4A and the fixing process shown in FIG. 4B.

Figure 4C:
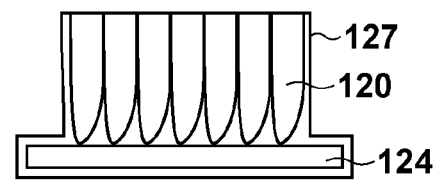
Figure 4D:
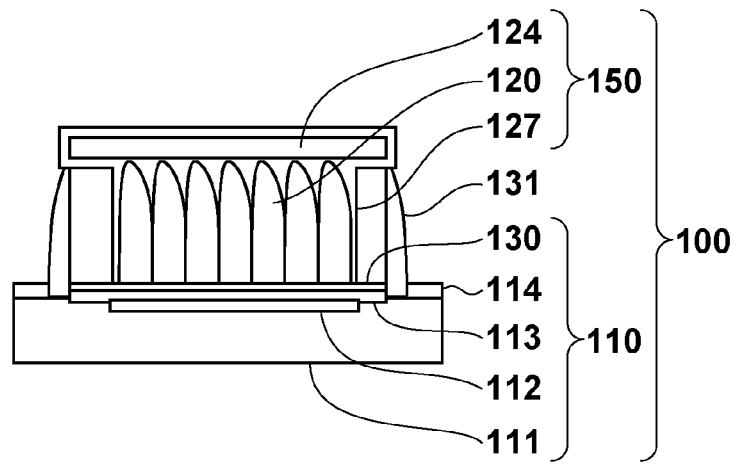

After the fixing process shown in FIG. 4B, separation and removal processes shown in FIG. 4C and an assembly process shown in FIG. 4D are executed. The separation, removal, and assembly processes can be the same as the separation process shown in FIG. 2C, the removal process shown in FIG. 2D, and the assembly process described with reference to FIG. 1, respectively.

According to the third embodiment, the mechanical strength of a structure including the scintillator is increased by protecting the scintillator by the protection layer. This can prevent, for example, cracking or chipping of the scintillator by a stress applied in removal of the scintillator. In addition, covering the scintillator with the protection layer suppresses deterioration of the scintillator by moisture.

The structure and manufacturing method of a radiation detection apparatus and scintillator panel according to the fourth embodiment of the present invention will be explained with reference to FIGS. 5A to 5F. Note that matters not mentioned here can comply with those in the first embodiment.

The manufacturing method in the fourth embodiment can include a growing process shown in FIG. 5A, a fixing process shown in FIG. 5B, a separation process shown in FIG. 5C, and a removal process shown in FIG. 5D. The respective processes can comply with the growing process shown in FIG. 2A, the fixing process shown in FIG. 2B, the separation process shown in FIG. 2C, and the removal process shown in FIG. 2D in the first embodiment. The same process as the removal process shown in FIG. 3B in the second embodiment may be executed between the growing process shown in FIG. 5A and the fixing process shown in FIG. 5B.

The manufacturing method in the fourth embodiment further includes a transfer process shown in FIG. 5E and a sealing process shown in FIG. 5F. In the transfer process shown in FIG. 5E, a sensor panel 110 is bonded via an adhesion layer 130 to a surface of a scintillator layer 120 that is opposite to a surface on the side of a second substrate 124. After that, the second substrate 124 is separated. As a result, the scintillator layer 120 is transferred to the sensor panel 110.

In the sealing process shown in FIG. 5F, a protection layer 140 covers the scintillator layer 120 and at least part of the sensor panel 110. The protection layer 140 can have a structure in which a hot-melt resin 141 to contact the scintillator layer 120, an aluminum foil 142 to cover the hot-melt resin 141, and a PET resin 143 to cover the aluminum foil 142 are stacked. So-called heat sealing (heat-press bonding) or resin sealing is preferably executed at the periphery of the protection layer 140 to improve moisture resistance and durability.

As a method of covering the scintillator layer 120 with the protection layer 140, a sheet prepared by stacking the hot-melt resin 141, aluminum foil 142, and PET resin 143, and the scintillator layer 120 can be laminated by thermal lamination. Of thermal lamination methods, a vacuum lamination method of performing heating and pressurization in vacuum can advantageously remove gas and moisture between the sheet and the scintillator layer 120.

The fourth embodiment can thin the member which protects the scintillator layer, decreasing the radiation absorptance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-012317, filed Jan. 24, 2011, which is hereby incorporated by reference herein in its entirety.

What is claimed is:

1. A method of manufacturing a scintillator panel including a scintillator layer which converts a radiation into light, the method comprising:
   a growing step of growing a scintillator including a plurality of columnar crystals on a first substrate;
   a fixing step of fixing a second substrate to a surface of the scintillator that is opposite to a surface on a side of the first substrate;
   a separation step of separating the first substrate from the scintillator; and
   a removal step of removing, from the scintillator, a portion of a predetermined thickness from an exposed surface of the scintillator that is exposed in the separation step, to form the scintillator layer.

2. The method according to claim 1, further comprising a step of removing, from the scintillator, a portion of a predetermined thickness from a surface of the scintillator that is opposite to the first substrate before the fixing step after the growing step.

3. The method according to claim 1, wherein in the fixing step, a protection layer is formed to cover an exposed side surface of the scintillator and at least a portion of an exposed surface of the second substrate that continues from the side surface of the scintillator, thereby fixing the second substrate to the surface of the scintillator that is opposite to the surface on the side of the first substrate.

4. A method of manufacturing a radiation detection apparatus, comprising a step of arranging a sensor panel which detects light converted by a scintillator layer, on a surface of the scintillator layer that is opposite to a surface on a side of a second substrate on a scintillator panel manufactured by a manufacturing method defined in claim 1.

5. The method according to claim 4, further comprising steps of:
   separating the second substrate from the scintillator layer after the step of arranging the sensor panel; and
   covering the scintillator layer and at least part of the sensor panel with a protection layer.

* * * * *